United States Patent
Lee et al.

(10) Patent No.: US 6,833,558 B2
(45) Date of Patent: Dec. 21, 2004

(54) PARALLEL AND SELECTIVE GROWTH METHOD OF CARBON NANOTUBE ON THE SUBSTRATES FOR ELECTRONIC-SPINTRONIC DEVICE APPLICATIONS

(75) Inventors: Yun Hi Lee, Seoul (KR); Byeong Kwon Ju, Seoul (KR); Yoon Taek Jang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 313 days.

(21) Appl. No.: 09/933,833

(22) Filed: Aug. 22, 2001

(65) Prior Publication Data

US 2002/0025374 A1 Feb. 28, 2002

(30) Foreign Application Priority Data

Aug. 23, 2000 (KR) ........................................ 2000/48907

(51) Int. Cl.$^7$ .................................................. D01F 9/12
(52) U.S. Cl. ....................................... 257/49; 423/447.3
(58) Field of Search .......................... 423/447.3; 257/49, 257/12

(56) References Cited

U.S. PATENT DOCUMENTS 6,528,020 B1 * 3/2003 Dai et al. ..................... 422/98

* cited by examiner

Primary Examiner—Stuart Hendrickson
(74) Attorney, Agent, or Firm—Morrison & Foerster LLP

(57) ABSTRACT

A selective and parallel growth method of carbon nanotube for electronic-spintronic device applications which directly grows a carbon nanotube on a wanted position toward a horizontal direction comprises the steps of: forming an insulating film on a board; forming fine patterns of catalyst metal layer including a contact electrode pad on the insulating film, forming a growth barrier layer for preventing vertical growth on upper part of the catalyst metal layer; and directly growing the carbon nanotube between the catalyst patterns.

16 Claims, 3 Drawing Sheets

PARALLEL AND SELECTIVE GROWTH METHOD OF CARBON NANOTUBE ON THE SUBSTRATES FOR ELECTRONIC-SPINTRONIC DEVICE APPLICATIONS

BACKGROUND OF THE INVENTION

1. Field of the Invention

The present invention relates to a parallel and selective growth method of carbon nanotubes (CNT), and particularly, to a parallel and selective growth method of carbon nanotubes for electronic-spintronic device applications which grows the carbon nanotubes directly on a wanted position.

2. Description of the Background Art

Recently, a new technique is required because miniaturization and integration of an element are made more rapidly and continually than before. At present, the smallest line width made in the manufactured silicon is about 0.17 $\mu$m, and it may be developed to be 0.1 $\mu$m of line width. However, it is difficult to develop a silicon having a line width smaller than 0.1 $\mu$m using a lithography art at present.

On the other hand, a carbon nanotube (hereinafter, referred to as CNT) found by Ijima of Japan is a new material of next generation which draws attention because of its unique electric and mechanic characteristics. In forming a terabit molecule device of nano size, to make the line width less than 0.1 $\mu$m without using the conventional lithography art is possible using a self-assembly technique or using selective growth of the CNT having a diameter of 1 nm~10 nm and moving by one-dimensional proton beam or wiring technique.

If the lithography technique is used, it has advantages for integration because of high ordering and reproducibility, however, it is subordinated to the development of the lithography technique. And the self-assembly technique uses a mechanism in which the materials are formed as nano size, and therefore it is difficult to reproduce and standardize, and it has disadvantages for integrated molecule device application of high yield.

On the basis of results of researches for the CNT, the nanotube may be form a foundation of an electronic engineering. The CNT is chemically inert comparing to another materials which are now studied, and is hard for pierls distortion, and is physically strong and elastic.

FIGS. 1a and 1b are drawings showing examples of conventional CNT growth.

As shown in FIG. 1a, it is difficult to standardize the CNT because a diameter and a length are grown irregularly due to the characteristics in synthesis process, and therefore an individual device is fabricated such that an individual CNT is manipulated and arrayed using a tip of STM (Scanning Tunneling Microscope) or of AFM (Atomic Force Microscope). However, in order to fabricate integrated nano-devices, a countless of CNTs are should be moved on wanted positions and adhered on the positions with an accuracy of atomic scale on a substrate.

Also, as shown in FIG. 1b, the CNT powder is refined a couple of times and dropped on a board on which a pattern is formed using a spin coating or a spit. After that, the CNT on unwanted position is removed using a needle of STM or of AFM, or the CNT decentralized in a solution is picked and arrayed on the board, however it is nearly impossible to fabricate an integrated device in this method.

On the other hand, in most compounding field, a technique which growing vertically for the board are now being developed in order to apply to display. However, even in a CNT film which is grown vertically and well arrayed, lengths of respective CNT are different from each other and intervals between the CNT are unequal, and therefore it is difficult to fabricate an electric device using the CNT in as-grown state.

Therefore, at present, a technique, in which the synthesized nanotubes are collected and refined a couple of times, and after that nanotubes having same diameter and length are separated, is developed in priority. And most researches in application devices fields are searching for reconstructing the grown CNT through the complex refine processes. Therefore, this inefficient fabricating processes are not able to be applied to practical fields such as highly integrated nanoelectronic devices or spintronic devices.

SUMMARY OF THE INVENTION

Therefore, an object of the present invention is to provide a parallel and selective growth method of semiconductive and conductive carbon nanotube for developing an electronic device of high integration by growing in horizontal direction on wanted position, between patterns, and on a wanted clearance with in-situ, and to provide an example of the application device.

To achieve the object of the present invention, as embodied and broadly described herein, there is provided a parallel and selective growth method of carbon nanotube for electronic and spintronic device applications comprising the steps of: forming an insulating film on a board; forming a fine pattern of catalyst metallic layer including a contact electrode pad on the insulating film; especially, forming a barrier layer for vertical growth on upper part of the catalyst metallic layer; and directly growing the carbon nanotube between the catalyst patterns.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The insulating film uses a thermal oxidation film made by thermal oxidation and CVD (Chemical Vapor Deposition) methods in an electric furnace of 1100° C., a $AL_2O_3$ thin film made by a sputter method, a $SiO_2/SixNy$ nitrogen film, or a layered structure of these.

It is desirable that the insulating film is formed to having a thickness of 50~1500 nm.

It is desirable that the catalyst metal is Ni, Ni/Ti (or Nb), Co, Co/Ti (or Nb), Fe, Fe/Ti (or Nb), (Ni/Co)n, (Co/Ni)n, (Co/Ni/Co)n, (Ni/Co/Ci)n (n=1, 2, 3, . . . ), and Co/Mg.

And it is desirable that the barrier layer for vertical growing uses an oxide film, a nitrogen film, or a layered structure of these two, and $SiO_2, Si_3N_4, SiO_2$—$Si_3N_4, Al_2O_3$, etc. In some cases, the growth wall layer may use metals, that is Ti, W, Nb, V, Au, or may use a compound metal of these metals. The metals are formed on the catalyst metal, or on upper part of the catalyst metal, and therefore block the vertical growth, but contribute to horizontal or side surface growth. The thickness of the oxide film or of the nitrogen film is varied within a range of 20~30 nm in order to make a top gate device later. The metal or compound metal wall can be used as an electrode later.

In addition, it is desirable that the catalyst metal has a purity higher than 3N, and is formed to have 100~400 nm thickness in a temperature range of normal temperature ~50° C.

The CNT(Carbon Nano Tube) growth is made in $C_2H_2$ (or $C_2H_4$)/$N_2$(He,Ar),$H_2$ or $NH_3$gas atmosphere, in gas pressure 10~500 Torr, and for 10~3000 seconds. $H_2$or $NH_3$ is included as a gas for carrying, and the mixture ratio is $C_2H_2$(or $C_2H_4$):$H_2$=1:1~10.

And it is desirable that the CNT growth is made using a thermochemistry gas phase deposition process (or a plasma process), and the temperature of the processing room is within a range of 500~900° C. (error range are ±10° C. at both ends).

The CNT growth uses an amorphous carbon thin film and graphite as an self-catalyst function, and growth speed is 100 nm/m.

And it is desirable that the spacing between catalyst metal patterns is 50 nm~10 $\mu$m.

In addition, it is desirable that the diameter of the CNT is 1~50 nm.

A normal metal, a superconductive metal, and a magnetic metal may be used as the contact electrode as well as growth barrier layer.

Hereinafter, the parallel and selective growth method of the carbon nanotube for electronic-spintronic device applications according to the present invention will be described in more detail as follows.

Figure 1A:
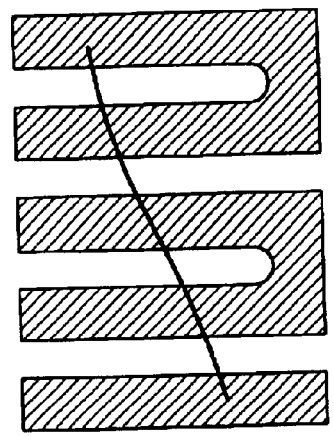
FIGS. 1a and 1b are drawings showing a conventional growth method of carbon nanotube.
Figure 1B:
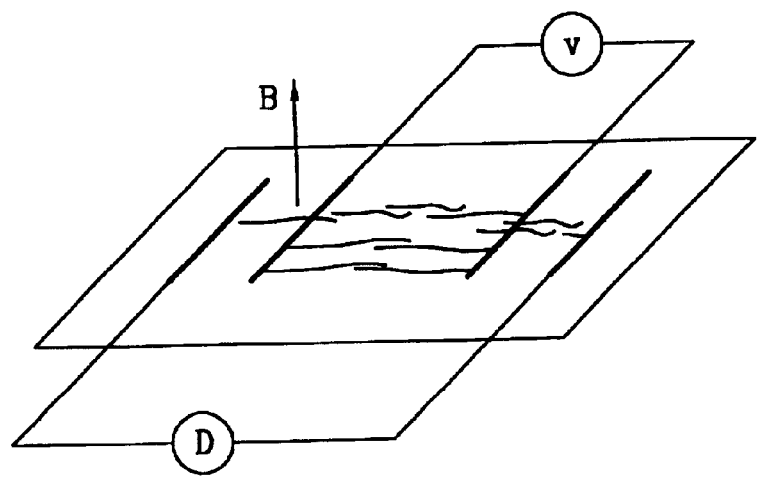
Figure 2A:
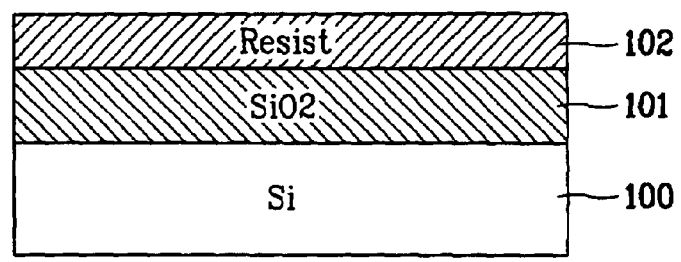
FIGS. 2a through 2c are cross-sectional views showing parallel and selective growth method of carbon nanotube according to an embodiment of the present invention.
Figure 2B:
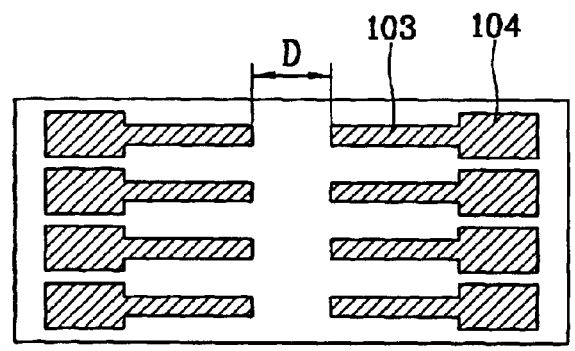
Figure 2C:
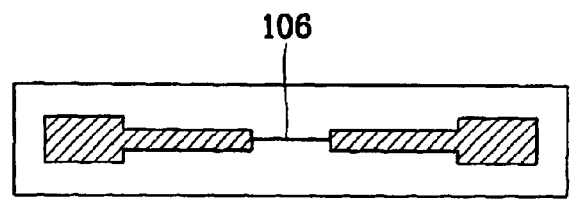
Figure 3A:
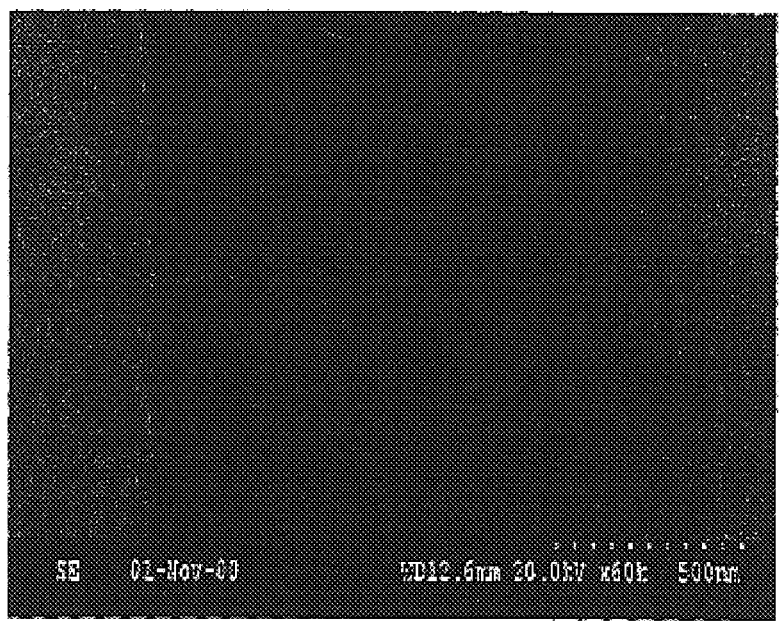
FIGS. 3a and 3b are drawings showing selective parallel growth of the carbon nanotube according to the embodiment of the present invention.
Figure 3B:
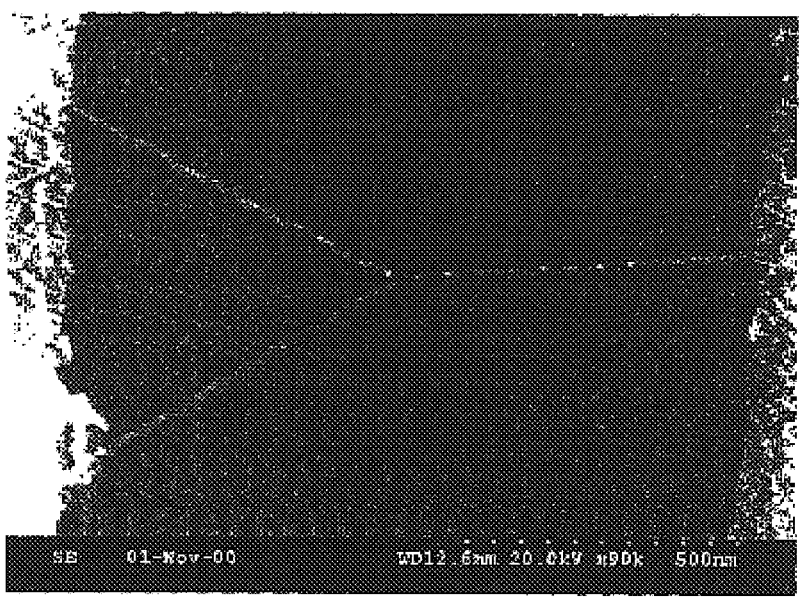

FIGS. 2a through 2c are cross-sectional view showing the parallel and selective growth method of carbon nanotube according to an embodiment of the present invention, and FIGS. 3a and 3b are drawings showing the parallel and selective growth of the carbon nanotube according to the embodiment of the present invention.

As shown in FIG. 2a, a gate insulating film 101 is formed on a board 100 using a wet oxidation process in an electric furnace of 1100° C. At that time, the thickness of the gate insulating film 101 is 500 nm, and $Al_2O_3$ is laminated on the insulating film as 10~50 nm thickness.

In addition, catalyst patterns are formed on the gate insulating film 101 with about 30 nm~10 $\mu$m intervals between them using an usual electron-beam litho method which forming catalyst patterns.

And as shown in FIG. 2b, one or plural catalyst metal layers 103 are formed using an electron-beam deposition or using a sputter deposition. At that time, a thickness of the catalyst metal layer is 10~400 nm in case that one layer is formed. In addition, in case that a Ti film as a buffer layer for restraining granulation of the catalyst layer which may happens during the growth of the CNT, the thickness of the catalyst metal layer may be formed to be thin. Also, the thickness of the baffle layer for that of the catalyst metal layer 103 is formed as larger than a ratio of 1:1.

In addition, a spacing between the catalyst layers 103 is about 50 nm~10 $\mu$m, and as a material of the catalyst metal layer 103, Ni, Ni/Ti (or Nb), Co, Co/Ti (or Nb), Fe, Fe/Ti (or Nb), (Ni/Co)n, (Co/Ni)n, (Co/Ni/Co)n, (Ni/Co/Ci)n(n=1, 2, 3, . . . ) and Co/MgO are can be used.

Also, as a material of the contact electrode pad 104, a normal metal, a superconductive metal, and a magnetic metal can be used, whereby various electronic-spintronic functions may be added.

In addition, a test piece, on which catalyst metal source having a purity higher than 3N is installed, is formed to have 30 nm~400 nm of thickness in the temperature range of normal ~150° C.

In addition, as a growth barrier layer (disturbance layer) for disturb the vertical growth upward the catalyst metal, an oxide or nitrogen, or, laminated/mixture structure of these two can be used, and also $SiO_2, Si_3N_4, SiO_2$—$Si_3N_4, Al_2O_3$ can be formed. Also, metals such as Ti, Pt, W, Nb, V, Au or compound metal of these metals can be used as the vertical growth wall layer(disturbance layer), and the disturbance layer is formed on upper part of the catalyst metal or of the catalyst metal pattern, whereby the disturbance layer blocks the vertical growth, but it distributes to horizontal or side surface growth. The thickness of the oxide film or of the oxy-nitride film is varied within the range of 20~300 nm in order to make a top gate device later besides the function of the growth barrier layer. The metal or compound metal barrier layer may function as an electrode in an electronic and spintronic device.

In addition, as shown in FIG. 2c, the CNT 106 is grown between the catalyst patterns selectively using a CVD (Chemical Vapor Deposition) method. At that time, the CNT 106 is grown in $C_2H_2/C_2H_4/N_2$ (or $H_2$, $NH_3$) atmosphere with 10~500 torr of gas pressure for 10~3000 seconds. In addition, the temperature of the processing room is to be within the range of 500~750° C.

The CNT 106 growth can use an amorphous carbon thin film and graphite as a self-catalyst. And the growth rate is faster than 100 nm/minute, and the diameter of the CNT 106 is within 1 nm~30 nm.

Herein, the grown CNT 106 is connecting the catalyst metal layer patterns 103 which are facing each other with a CNT 106 bridge, as shown in FIG. 3a.

That is, the thicknesses of edge and of center in the catalyst metal pattern are almost same after photo etching or electron beam etching, and therefore the square pattern is precisely defined as it was designed. And, the edge of the pattern, which is defined as electron beam etching before, is contracted and expanded during the temperature of the reactor reaches to a processing temperature for horizontal growth of the CNT 106, and thereby the edge of the pattern becomes thinner. And a root is generated centering around the thinned edge, and the CNT 106 growth is started selectively therefrom.

As shown in FIG. 3a, the contrast is very high on the edge of the pattern, and that position designates the part of the catalyst metal layer 103 having thinner thickness than that of center part.

Also, as shown in FIG. 3b, the CNT 106 which is horizontally grown while connecting the electrodes has both ends buried inside the catalyst electrodes which are facing each other, whereby high contact resistance problem which may be generated in CNT-electrode contact can be solved.

Effects of the selective and parallel growth method of carbon nanotube for electronic and spintronic device applications according to the present invention will be described as follows.

The method according to the present invention can be used as an essential and core art in making all electronic and spintronic devices using carbon nanotube, and integrated devices of them, and in a nanowire technique for wiring and connection between devices of nanosize by growing the CNT directly on a wanted position selectively toward horizontal direction (lateral direction).

Also, the both ends of the CNT which is grown horizontally while connecting the electrodes are buried inside the catalyst electrodes which are facing each other, whereby high contact resistance problem which may be generated in CNT-electrode contact can be solved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A parallel and selective growth method of carbon nanotube on the substrates for electronic-spintronic device applications comprising:

forming an insulating film on a substrate;

forming patterns of catalyst metal layer including a contact electrode pad on the insulating film;

forming a growth barrier layer for vertical growth on upper part of the catalyst metal layer; and directly growing a carbon nanotube which joins catalyst patterns, wherein the contact electrode pad is formed before growing the carbon nanotube.

2. The method according to claim 1, wherein the insulating film is formed by using an oxidation method and CVD (Chemical Vapor Deposition) method in an electric furnace of 1100° C.

3. The method according to claim 1, wherein the insulating film is formed to have thickness of 50~500 nm.

4. The method according to claim 1, wherein the catalyst metal uses at least one among Ni, Ni/Ti (or Nb), Co, Co/Ti (or Nb), Fe, Fe/Ti (or Nb), (Ni/Co)n, (Co/Ni)n, and (Co/Ni/Co)n, (Ni/Co/Ni)n wherein n is a positive integer, and Co/MgO.

5. The method according to claim 1, wherein the catalyst metal has a purity higher than 99.9%, and is formed to have 80~400 nm thickness in the temperature range of normal temperature ~150° C.

6. The method according to claim 1, wherein the CNT is grown in $C_2H_2$ (or $C_2H_4$)/$N_2$(He, Ar), $H_2$, $NH_3$ atmosphere with 10~5000 torr of gas pressure for 10~3000 seconds.

7. The method according to claim 1, wherein the CNT is grown using a thermochemistry gas phase deposition process (or a plasma process), and the temperature of a processing chamber wherein the CNT is grown is to be 500~900° C. (error range ±10° C. at both ends).

8. The method according to claim 1, wherein the CNT growth uses an amorphous carbon thin film and a graphite as a self-catalyst, and the growth speed is 100 nm/minute.

9. The method according to claim 1, wherein a clearance between the catalyst metal patterns is within 50 nm~10 $\mu$m.

10. The method according to claim 1, wherein a diameter of the CNT is within 1~50 nm.

11. The method according to claim 1, wherein the contact electrode uses normal metals, superconductive metals, or magnetic metals.

12. The method according to claim 1, wherein one among an oxide film, a nitride film, a layered structure of the oxide film and the nitride film, or $SiO_2$, $Si_3N_4$, $SiO_2$—$Si_3N_4$, $Al_2O_3$ is used as the growth barrier layer for vertical growth.

13. The method according to claim 1, wherein as the growth barrier layer for vertical growth, Ti, Pt, W, Nb, V, Au or a compound metal of combinations thereof is used.

14. The method according to claim 12, wherein thickness of the growth barrier layer is varied within 20~30 nm in order to embody a top gate device.

15. The method according to claim 13, wherein the growth barrier layer comprises an electrode for eletronic- and spintronic devices.

16. The method of claim 1, wherein the catalyst metal layer including the contact electrode pad and the growth barrier layer are formed in one step.

* * * * *